United States Patent [19]

Ezell et al.

[11] Patent Number: 5,812,005
[45] Date of Patent: Sep. 22, 1998

[54] AUTO ZERO CIRCUITRY AND ASSOCIATED METHOD

[75] Inventors: William Richard Ezell, Carrollton; Robert Mounger, Dallas, both of Tex.

[73] Assignee: Dallas Semiconductor Corp., Dallas, Tex.

[21] Appl. No.: 688,589

[22] Filed: Jul. 30, 1996

[51] Int. Cl.$^6$ .................................................. H03F 1/02
[52] U.S. Cl. ............................ 327/307; 327/362; 327/78; 327/63; 330/9; 330/261
[58] Field of Search .................................. 327/362, 307, 327/79, 78, 83, 65, 375, 63; 330/9, 261

[56] References Cited

U.S. PATENT DOCUMENTS

| | | | |
|---|---|---|---|
| 4,591,740 | 5/1986 | Anderson et al. | 327/378 |
| 5,045,806 | 9/1991 | Yan | 330/9 |
| 5,061,900 | 10/1991 | Vinn et al. | 330/9 |
| 5,124,663 | 6/1992 | McEntarfer et al. | 330/9 |
| 5,323,121 | 6/1994 | Butler | 330/261 |
| 5,512,848 | 4/1996 | Yaklin | 327/307 |
| 5,550,512 | 8/1996 | Fukahori | 330/261 |
| 5,600,275 | 2/1997 | Garavan | 327/307 |
| 5,610,557 | 3/1997 | Jett, Jr. | 330/261 |

*Primary Examiner*—Terry Cunningham
*Assistant Examiner*—Eunja Shin
*Attorney, Agent, or Firm*—Jenkens & Gilchrist

[57] ABSTRACT

A circuit and associated method for determining the offset bias of a comparator by first shorting together the inputs of the comparator to apply the same voltage signal at each of the inputs of the comparator. The voltage signal at one of the inputs is then offset a select amount by applying varying selected resistances from a variable resistor to the comparator. The variable resistor is controlled by a programmable controller that is responsive to an input clock signal. At each selected amount of offset applied to the input, the output is monitored to determine if the output of the comparator has flipped, or changed state. When the output flips, the corresponding resistance setting is used to compensate for the corresponding offset bias of the comparator.

7 Claims, 2 Drawing Sheets

AUTO ZERO CIRCUITRY AND ASSOCIATED METHOD

CROSS REFERENCE TO RELATED APPLICATIONS

This application is related to the following U.S. patent applications:

| Ser. No. | TITLE | INVENTOR(S) |
|---|---|---|
| 08/688,444 | Battery Pack Monitoring System | Richard E. Downs Robert Mounger |
| 08/688,479 | Digitally Adaptive Biasing Regulator | Richard William Ezell Robert Mounger |

All of the related applications are filed on even date herewith, are assigned to the assignee of the present invention, and are hereby incorporated herein in their entirety by this reference thereto.

FIELD OF THE INVENTION

The present invention relates to electronic circuits, and more specifically, to an apparatus and method for determining and compensating for operating tolerances in an electronic component, such as a comparator.

BACKGROUND OF THE INVENTION

With the ever increasing demand put upon manufacturers of electronics for low cost and high performance, a problem that many of these manufactures of electronic devices are encountering is being able to compensate for the operating tolerances or offset characteristics of the electronic devices. Mismatch is introduced between electronic components because no components can be perfectly manufactured. For example, a comparator, in its basic form, compares two inputs to determine which one is of higher magnitude. It outputs a high or low response depending on whether a first input is higher than a second input, and in operation should operate over a wide common mode range. This means that the comparator should function properly whether operating at low or high voltages. The offset characteristics of a comparator produces a range of values for which a lower signal applied to the first terminal will still produce a low response or for which a higher signal applied to the second terminal will produce a high response.

One current way of determining and compensating for the offset between the two terminals of the comparator is through the use of capacitors, which are able to hold a charge for repeated sampling. The comparator's inputs are sampled, and by a series of switches the offset of the comparator is determined. This determined offset can then be stored on the capacitors for a short period.

However, there are several drawbacks to this method. First, charging the capacitors consumes considerable power, compared to the comparator, and must be of high fidelity. This makes the method unattractive for a low cost, low power type devices. Also, due to parasite leakages across the capacitor, the offset can be stored for only a short duration. These leakages increase with increased temperature, which limits the operating temperature of the device. The capacitors themselves will also degrade over time.

Another way of compensating for offset is by trimming the device. This method is often used for computer chips. In this method, a set of resistors is implanted on a chip. During the manufacturing process, but after the chip is made, the bias is determined and compensated for by fusing or severing the links between the resistors on the chip. On-chip trimming techniques can reduce offset voltage to a very low value.

The trimming technique has a drawback in that it is one time or a single shot operation and is therefore only provides compensation for the offset of the conditions under which it was tested. For a system that may undergo a wide range of operating conditions, trimming may not be optimal. There is also an increased cost of manufacturing when using this method.

SUMMARY OF THE INVENTION

The present invention overcomes the above identified problems as well as other shortcomings and deficiencies of existing technologies by providing a low cost, low power, accurate, and repeatable apparatus and method for determining the offset bias level in a comparator across a wide range of operating conditions and by providing the ability to compensate for this bias each time it is calculated.

The present invention takes advantage of the fact that there is no severe time constraint to determine the offset characteristics by successive approximation testing, testing one bit at a time from the least significant bit to the most significant bit, and then looking to see where the comparator changes state, or flips. Basically, the amount of offset is increased in 0.5 mV increments up to 50 mV on either input in a prescribed manner, at any present operating condition, until the output flips, which shows the amount of offset.

To make the bias determination, the input terminals are shorted together at or near the voltage at which the comparator will operate. The output of the comparator is recorded. The circuit allows varying degrees of input signal strength to be siphoned from either input terminal, in response to a digital code, which will be supplied from an outside source. The outside source also monitors the device to determine when the output flips. After determining when the output of the comparator flips, the outside device can record the setting of the digital switches and use this setting when it actually performs the comparison. A repeat of the sequence can be used to determine the bias for the opposite input. Determining which input side is tested is controlled by the digital input code.

Because the circuit can be zeroed at any time, the device is less sensitive to operating conditions. Mechanical stress, thermal stress, and other operating conditions will not significantly effect the performance if the actual comparison is done shortly after the bias calculation is performed. Further, because the offset is stored digitally as opposed to with a capacitor, the circuit can withstand extended periods of time between zeroings.

In conjunction with stipulations of a low power device, the circuit can be turned off or placed in standby mode when not in use.

The present invention is particularly useful in applications that have a wide range of operating conditions, input signal strength, temperature, mechanical stress, etc., require low power consumption, and do not require high speed. It is envisioned that this device will be used in the MILSPEC temperature range, which will make it even more reliable than capacitor storage schemes, due to their leakage.

BRIEF DESCRIPTION OF THE DRAWINGS

A more complete understanding of the apparatus of the present invention may be had by reference to the following Detailed Description and appended claims when taken in conjunction with the accompanying drawings wherein:

DETAILED DESCRIPTION

Figure 1:
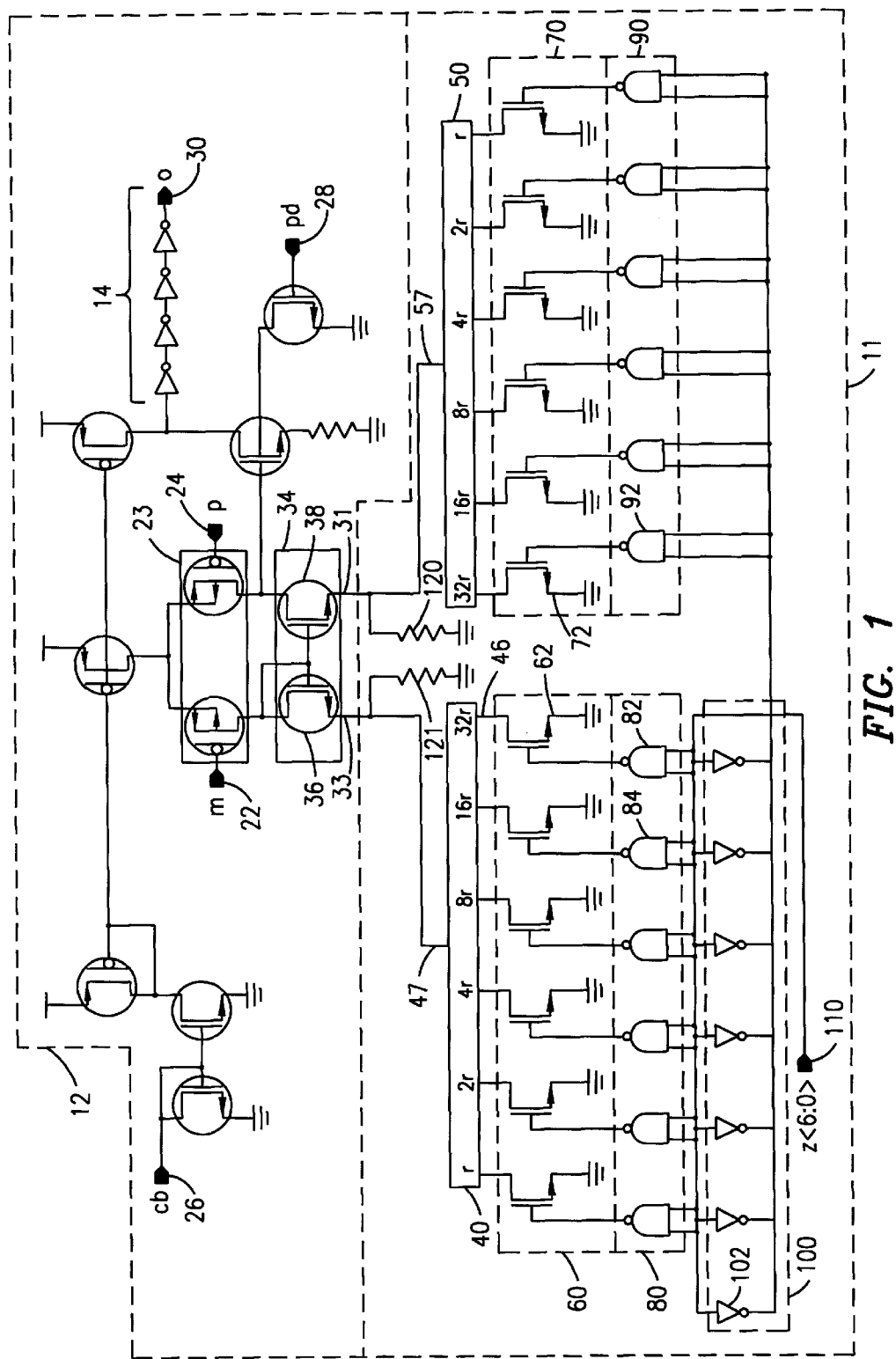
FIG. 1 is a schematic diagram of the present invention illustrating an auto zeroing circuit attached to a comparator.

Referring now to FIG. 1, there is illustrated a detailed schematic of an auto zero comparator circuit 10. As depicted auto zero comparator circuit 10 includes auto zeroing circuitry 11 connected to comparator 12 at connections 31 and 33.

Although the auto zeroing circuitry 11 is described for use with a comparator, it is contemplated that other types of electronic circuits could have their offset determined and compensated for in a similar manner.

Comparator 12 includes input terminals 22 and 24 where the signals to be compared enter the circuit. The two input terminals 22 and 24 are connected to a differential pair 23, which is connected to a current mirror 34. The current mirror 34 includes two N-Channel MOSFETs 36 and 38. Comparator 12 further includes input terminals 26 and 28 which are for receiving bias currents for turning comparator 12 on and off Comparator 12 further includes an output 30 which is passed through a string of inverters 14.

Auto zeroing circuit 11 includes variable resistor banks 40 and 50, two sets of multiple N-Channel MOSFETs 60 and 70, two sets of multiple nand gates 80 and 90, a set of multiple inverters 100, and an input 110.

N-Channel MOSFETs 36 and 38 of current mirror 34 are each connected to an n-depletion resistors 121 and 120, respectively, which are in turn connected to ground. As can be seen variable resistors banks 40 and 50 are each connected to resistors 121 and 120, respectively, at connections 47 and 57.

Figure 2:
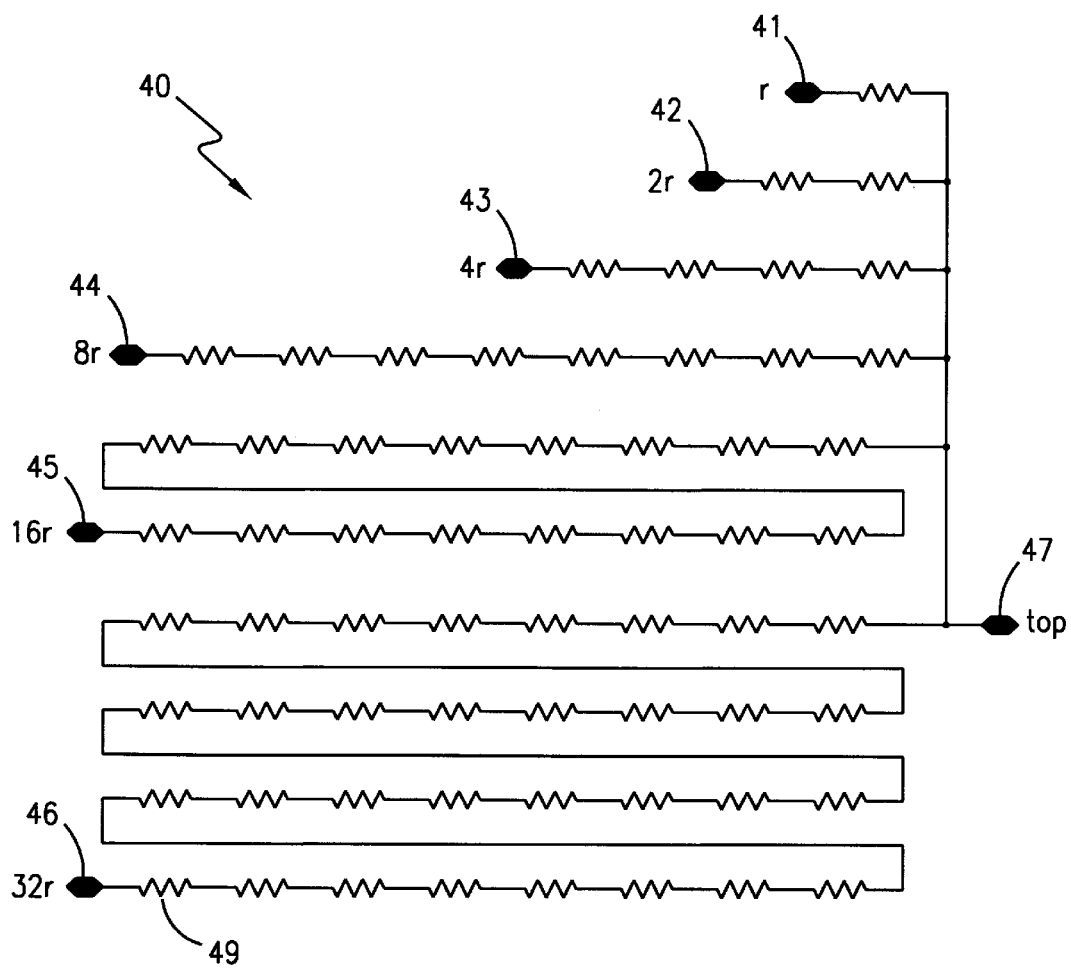
FIG. 2 is a more detailed schematic diagram of a binary weighted, parallel resistor bank utilized by the present invention.

Connection 47, which affects input 22 of comparator 12, is the output of the first resistor bank 40. The resistor bank 40, shown in detail in FIG. 2, includes a series of parallel branches 41, 42, 43, 44, 45 and 46, with the single output tap 47. Each of the parallel resistive branches 41–46 include multiple n-depletion resistors, as depicted by resistor 49. However the number of resistors in each branch varies, whereby the total resistance value in each branch also varies from branch to branch. The number of resistors in each of the branches 41–46 increases by a multiplicative factor of two, producing a binary weighting between the branches. Each of the resistive branches 41–46 is connected a corresponding separate MOSFET of the bank of MOSFETs 60.

Although variable resistor bank 40 is depicted with a binary weighted resistive values, it is contemplated to be within the scope of the invention that other schemes of weighting the branches could be utilized.

The bank of N-Channel MOSFETs 60 is composed of six N-Channel MOSFETs, such as MOSFET 62. Each of the MOSFETs is connected to a corresponding branch of the resistor bank 40. For example, MOSFET 62 is connected to branch 46. Each resistor branch 41, 42, 43, 44, 45, 46 is connected to the drain node of the corresponding N-Channel MOSFET in the bank 60. Each source node of the MOSFETs in the bank 60 is connected to ground. The gate node of each MOSFET in the bank 60 is connected to the output of a corresponding nand gate in a set of nand gates 80.

The set of nand gates 80 is composed of a six nand gates, each connected to corresponding MOSFET in bank 60. For example, nand gate 82 is connected to MOSFET 62. Each of the inputs of the nand gate of the set of nand gates 80 are connected to the input source 110 for the auto zeroing current 11.

Although the resistor bank 40, bank of MOSFETs 60, and set of nand gates 80 are all shown with six branches, it is contemplated to be within the scope of the invention that any number of branches could be utilized.

Input 110 of auto zeroing circuitry 11 is also connected to the input of multiple inverters 100. Each of the outputs of multiple inverters 100 is connected to and feeds into the second set of nand gates 90, which is similar to the first set of nand gates 80. The output of each of the nand gates in this set 90 is connected again to a corresponding MOSFET in a bank of N-Channel MOSFETs 70.

The bank of N-Channel MOSFETs 70 is comprised of six N-Channel MOSFETs, each of which are connected to a corresponding nand gate of nand gates 90 through their gate nodes. For example, the gate of N-Channel MOSFET 72 is connected to the output of nand gate 92. The source nodes of each of the MOSFETs is connected to ground, and the drain nodes are connected to a corresponding branch of bank 50.

The resistor bank 50 includes six parallel branches, each having a different resistance. The resistor bank 50 is identical to resistor bank 40 shown in FIG. 2. Each branch of the resistor bank 50 is connected to a corresponding MOSFET of the set of MOSFETs 70. The output of the resistor bank 50 is connected to resistor 120 and current mirror 34. Resistor bank 50 is connected in parallel with the resistor 120, which is connected to ground.

Although the resistor bank 50, bank of MOSFETS 70, and set of nand gates 90 are all shown with six branches, it is contemplated to be within the scope of the invention that any number of branches could be utilized.

In the operation of circuit 10, the input terminals 22 and 24 will be shorted together at the next level of hierarchy, outside of the circuit 10. The voltage will be at or near the voltage at which the actual comparison will be performed. At the same time, all of the nand gates in the two sets of nand gates 80 and 90 will be deactivated, and hence the MOSFETs in banks 60 and 70 will be open to ground. The output of the comparator 30 will be recorded by an external control source. A digital input code will then be introduced to the auto zeroing circuit 11 and input 110 which will activate the first nand gate 82 in the set of nand gates 80. The activation of 82 will supply a gate voltage to the MOSFET 62 connected to it, which will allow current to flow from the first resistor branch 46 of the resistor bank 40. By allowing current to flow through 62 to ground, a small amount of current will flow through connection 47, decreasing MOSFET 36's source and gate voltages, thereby decreasing the current through MOSFET 38. The net effect of these changes will be to add positive offset to any pre-existing bias.

If this digital control setting effectuates a switch of the comparator output 30, the setting is recorded for use in the actual comparison. If the comparator output 30 does not flip, another setting is tried. For example, nand gates 82 and 84 will be active together, which will draw even more current. Due to the binary resistor weighting in resistor 40, the bias current can be controlled in 0.5 mV increments up to 50 mV. Once a combination in the set of nand gates 80 flips the output of the comparator 30, an external device may record the digital input 110 at which this occurred.

The next step in the operation is to deactivate the first set of nand gates 80 and begin activating the second set of nand gates 90, which correspond to input 24 of the comparator 12. Again different combinations of the set of nand gates 90 are activated until the output 30 is flipped. However, conversely to the operation of nand gates 80, which add positive offset, the operation of nand gates 90, and MOSFETS 70 induce negative offset.

The second set of nand gates 90 is controlled by passing the digital input received at input 110 through the seven inverters 100. The last inverter 102 in the series of seven inverters 100 controls whether the second series of nand gates 90 is active or not. Activating any nand gate in 80 will necessitate any nand gate in 90 being inactive because of 102, and activating a nand gate in 90 will keep the nand gates in 80 from being active.

Although a preferred embodiment of the method and circuit of the present invention has been illustrated in the accompanying Drawings and detailed description, it will be understood that the invention is not limited to the embodiment disclosed, but is capable of numerous rearrangements, modifications, and substitutions without departing from the spirit of the invention as set forth and defined by the following claims.

What is claimed is:

1. A circuit for determining offset bias of a comparator having at least two inputs and an output with each of the at least two inputs shorted together to receive the same initial signal, said circuit comprising:

a variable resistor connected to the comparator, said variable resistor including an output for outputting varying resistances for biasing the initial signal received at a first of the at least two inputs of the comparator;

a programmable controller connected to said variable resistor, said controller responsive to an input signal for controlling the varying resistances outputted by said variable resistor such that an offset bias of the comparator of the first input being determined when the output of the comparator flips for a corresponding selected resistance of said variable resistor;

said variable resistor including at least two input taps, each of said at least two input taps selectable by said controller, such that if a first of said at least two input taps is selected by said controller a first resistance is outputted, and if a second of said at least two input taps is selected by said controller a second resistance is outputted, and if each of said at least two input taps is selected by said controller, a third resistance is outputted;

said controller including at least two transistors, with each of said at least two transistors being coupled to a separate one of said at least two input taps of said variable resistor, each of said at least two transistors for selecting at least two input taps of said variable resistor; and said controller further including at least two logic nand gates, each of said at least two logic nand gates being coupled to a separate one of said at least two transistors, each of said at least two logic nand gates being responsive to the input signal and for controlling said at least two transistors selecting said at least two input taps of said variable resistor.

2. The circuit as recited in claim 1, and further comprising:

a second variable resistor connected to the comparator, said second variable resistor including an output for outputting varying resistances for biasing the initial signal received at a second of the at least two inputs of the comparator; and a second controller connected to said second variable resistor, said controller responsive to the input signal for controlling the varying resistances outputted by said second variable resistor such that an offset bias of the second input of the comparator being determined when the output of the comparator flips for a corresponding selected resistance of said second variable resistor.

3. The circuit as recited in claim 2, wherein:

said second variable resistor includes at least two input taps, each of said at least two input taps of said second variable resistor selectable by said second controller, wherein if a first of said at least two input taps of said second variable resistor is selected by said second controller a fourth resistance is outputted, and further wherein if a second of said at least two input taps of said second variable resistor is selected by said second controller a fifth resistance is outputted, and further wherein if each of said at least two input taps of said second variable resistor are selected by said second controller a sixth resistance is outputted.

4. The circuit as recited in claim 2, wherein said second controller is programmable.

5. The circuit as recited in claim 3, wherein said second controller includes at least two transistors, with each of said at least two transistors of said second controller being coupled to a separate one of said at least two input taps of said second variable resistor, each of said at least two transistors of said second controller for selecting said at least two input taps of said second variable resistor.

6. The circuit as recited in claim 5, wherein said second controller at least two logic nand gates, with each of said at least two logic nand gates of said second controller coupled to a separate one of said at least two transistors of said second controller, each of said at least two logic nand gates of said second controller being responsive to the input signal and for controlling said at least two transistors of said second controller selecting said at least two input taps of said second variable resistor.

7. A circuit for determining offset bias of a comparator having first and second inputs and first and second outputs, with each of the inputs shorted together to receive the same voltage signal, said circuit comprising:

a first variable resistor coupled to the comparator, said first variable resistor including an output for outputting varying resistances for biasing the voltage signal received at the first input of the comparator;

a second variable resistor coupled to the comparator, said second variable resistor including an output for outputting varying resistances for biasing the voltage signal received at the second input of the comparator;

a programmable controller coupled to said first and second variable resistors, said controller responsive to an input signal for controlling the varying resistances outputted by said first and second variable resistors, such that the offset bias of the comparator of the first input being determined when the output of the comparator flips for a corresponding selected resistance of said first variable resistor and the offset bias of the comparator for the second input being determined when the output of the comparator flips for a corresponding selected resistance of said second variable resistor;

each of said first and second variable resistors including at least two input taps, each of said at least two input taps for said first and second variable resistors being individually selectable by said controller to produce varying resistances outputted by said first and second variable resistors;

said controller including a plurality of transistors, each of said plurality of transistors being coupled to a separate input tap of said each of said at least two input taps of said first and second variable resistors, said transistors for selecting said input taps of said first and second variable resistors; and said controller further including a plurality of logic nand gates, with each of said plurality of logic nand gates being coupled to a separate one of said plurality of transistors, each of said plurality of logic nand gates for controllably selecting said plurality of transistors.

* * * * *